(12) United States Patent
Mui et al.

(10) Patent No.: US 8,081,514 B2
(45) Date of Patent: Dec. 20, 2011

(54) PARTIAL SPEED AND FULL SPEED PROGRAMMING FOR NON-VOLATILE MEMORY USING FLOATING BIT LINES

(75) Inventors: Man Mui, Santa Clara, CA (US); Yingda Dong, San Jose, CA (US); Binh Lee, San Jose, CA (US); Deepanshu Dutta, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 365 days.

(21) Appl. No.: 12/547,449

(22) Filed: Aug. 25, 2009

(65) Prior Publication Data

US 2011/0051517 A1    Mar. 3, 2011

(51) Int. Cl.
*G11C 16/04* (2006.01)
*G11C 16/06* (2006.01)

(52) U.S. Cl. ......... 365/185.17; 365/185.19; 365/185.29; 365/185.23; 711/156

(58) Field of Classification Search ............. 365/185.17, 365/185.19, 185.25, 185.23, 185.09, 185.02; 711/156

See application file for complete search history.

(56) References Cited

U.S. PATENT DOCUMENTS

| | | | |
|---|---|---|---|
| 6,005,802 A | 12/1999 | Takeuchi et al. | |
| 7,313,023 B2 | 12/2007 | Li | |
| 7,400,534 B2 | 7/2008 | Maejima | |
| 7,447,079 B2 | 11/2008 | Nguyen | |
| 7,506,113 B2 | 3/2009 | Li | |
| 7,508,721 B2 | 3/2009 | Li | |
| 2006/0120165 A1 | 6/2006 | Hemink | |
| 2009/0010068 A1 | 1/2009 | Lee | |
| 2009/0059660 A1 | 3/2009 | Lee | |
| 2009/0067245 A1 | 3/2009 | Isobe et al. | |

OTHER PUBLICATIONS

International Search Report & The Written Opinion of the International Searching Authority dated Oct. 21, 2010, International Application No. PCT/US2010/046312 filed Aug. 23, 2010.

*Primary Examiner* — Anh Phung
*Assistant Examiner* — Hai Pham
(74) *Attorney, Agent, or Firm* — Vierra Magen Marcus & DeNiro LLP

(57) ABSTRACT

Partial speed and full speed programming are achieved for a non-volatile memory system. During a program operation, in a first time period, bit lines of storage elements to be inhibited are pre-charged, while bit line of storage elements to be programmed at a partial speed and bit lines of storage elements to be programmed at a full speed are fixed. In a second time period, the bit lines of storage elements to be programmed at the partial speed are driven higher, while the bit lines of storage elements to be inhibited are floated and the bit line of storage elements to be programmed remain fixed. In a third time period, the bit lines of storage elements to be inhibited are driven higher while the bit lines of the storage elements to be programmed at the partial speed or the full speed are floated so that they couple higher.

20 Claims, 15 Drawing Sheets

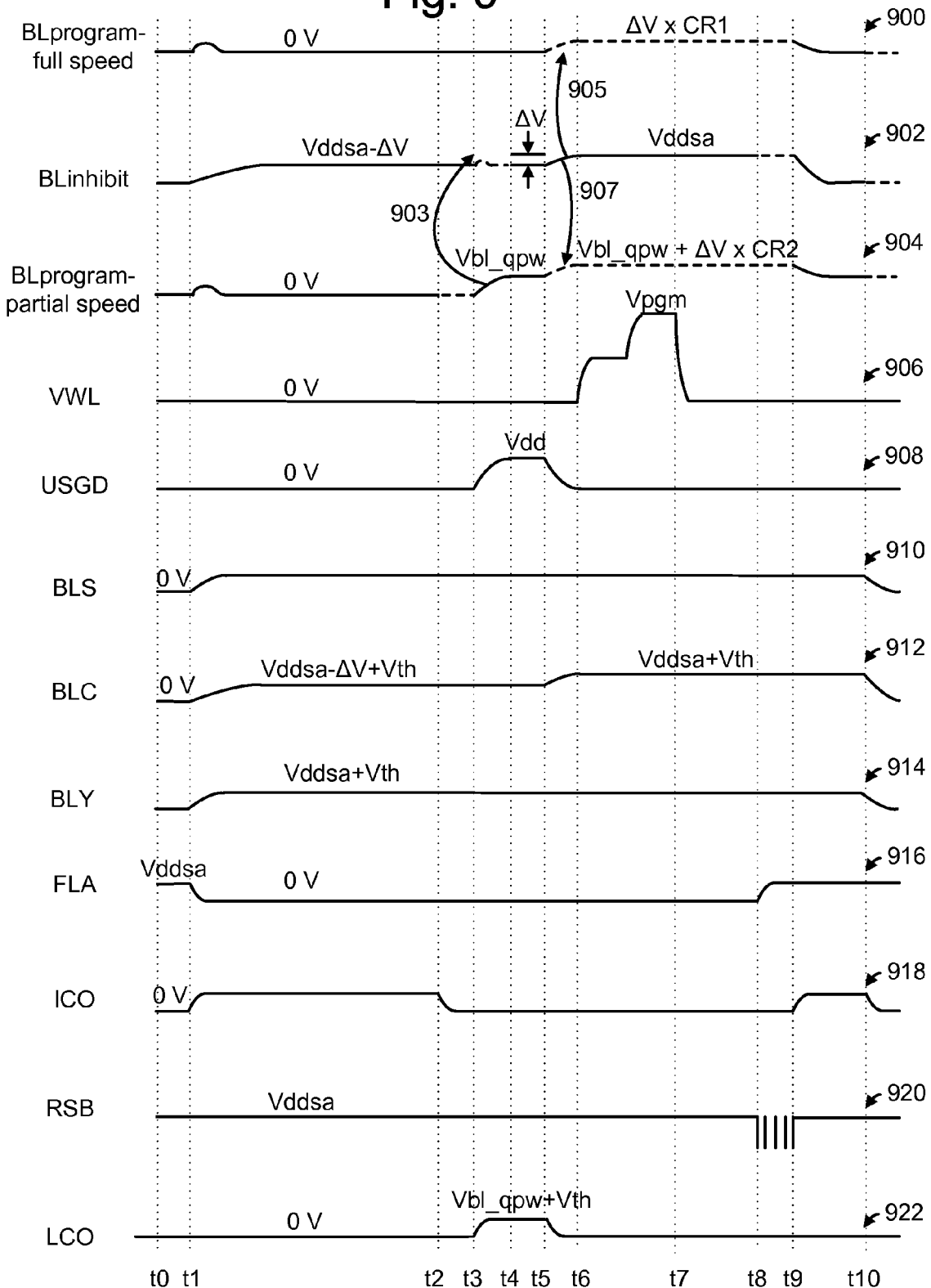

PARTIAL SPEED AND FULL SPEED PROGRAMMING FOR NON-VOLATILE MEMORY USING FLOATING BIT LINES

BACKGROUND

The present technology relates to non-volatile memory.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a storage element or cell with a floating gate that is used to store two ranges of charges and, therefore, the storage element can be programmed/erased between two states, e.g., an erased state and a programmed state. Such a flash memory device is sometimes referred to as a binary flash memory device because each storage element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each storage element can store two bits of data when the element can be placed in one of four discrete charge bands corresponding to four distinct threshold voltage ranges.

Typically, a program voltage Vpgm applied to the control gate during a program operation is applied as a series of pulses that increase in magnitude over time. The program voltage can be applied to a selected word line. In one possible approach, the magnitude of the pulses is increased with each successive pulse by a predetermined step size, e.g., 0.2-0.4 V. Vpgm can be applied to the control gates of flash memory elements. In the periods between the program pulses, verify operations are carried out. That is, the programming level of each element of a group of storage elements being programmed in parallel is read between successive program pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically Vpgm is applied to the control gate and the bit line is grounded, causing electrons from the channel of a storage element to be injected into the floating gate. When electrons accumulate in the floating gate, the floating gate becomes negatively charged and the threshold voltage of the storage element is raised so that it is considered to be in a programmed state.

However, as memory devices become smaller, capacitive coupling effects become more problematic during programming.

BRIEF DESCRIPTION OF THE DRAWINGS

FIG. 9 depicts a time line of a program operation for use with the circuit of FIG. 10a.

FIG. 11 depicts a time line of a program operation for use with the circuit of FIG. 12a.

DETAILED DESCRIPTION

A method and non-volatile storage system are provided in which channel-to-floating gate capacitive coupling is reduced while providing partial speed programming.

As memory devices become smaller, capacitive coupling effects become more problematic. In particular, during programming, storage elements which have completed programming are inhibited by raising their channel potential via an increased bit line voltage. However, this increased channel potential can couple to the floating gate of a nearby storage element which is still being programmed, inadvertently raising the potential of the floating gate. Typically, the potential of the channel of the storage element which is still being programmed is held at 0 V. One approach to avoiding such coupling is to allow the channel to float for the storage element which is still being programmed. However this does not allow partial speed programming, in which the channel potential of the storage element which is still being programmed is raised above 0 V to slow down, but not fully inhibit, programming. A solution herein causes the channel to float for the storage element which is still being programmed at a potential which slows down, but does not fully inhibit, programming.

Figure 1A:
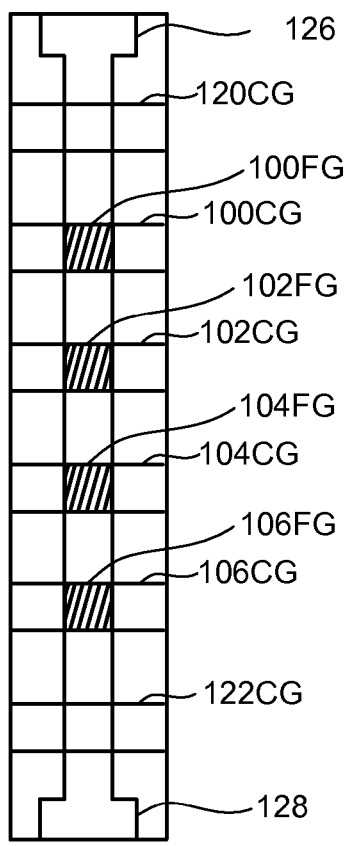
FIG. 1a is a top view of a NAND string.
Figure 1B:
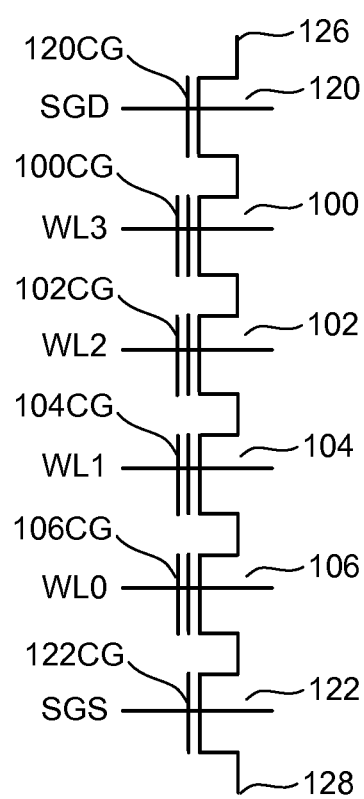
FIG. 1b is an equivalent circuit diagram of the NAND string.

One example of a suitable memory system uses the NAND flash memory structure, which arranges multiple transistors in series between two select gates. The transistors in series and the select gates are referred to as a NAND string. FIG. 1a is a top view showing one NAND string. FIG. 1b is an equivalent circuit thereof. The NAND string depicted includes four transistors, 100, 102, 104 and 106, in series and sandwiched between a first select gate 120 and a second select gate 122. Select gate 120 connects the NAND string to bit line 126. Select gate 122 connects the NAND string to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. In one embodiment, transistors 100, 102, 104 and 106 are each memory cells. In other embodiments, the memory cells may include multiple transistors or may be different than that depicted. Select gate 120 is connected to select line SGD. Select gate 122 is connected to select line SGS.

Figure 2:
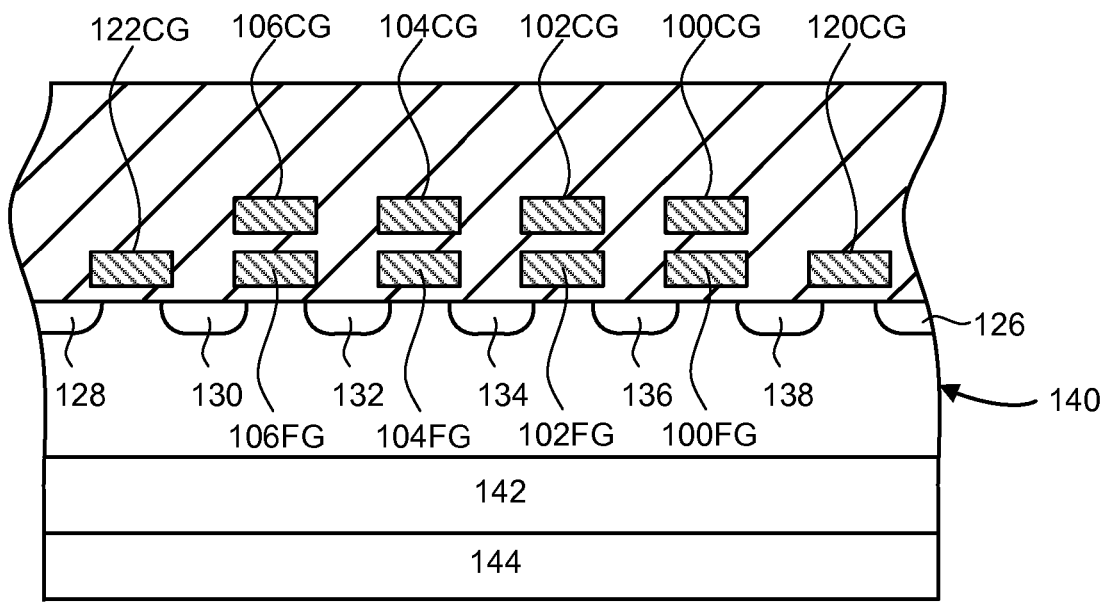
FIG. 2 is a cross-sectional view of the NAND string.

FIG. 2 provides a cross-sectional view of the NAND string described above. The transistors of the NAND string are formed in p-well region 140. The p-well region in turn may be within an n-well region 142 of a p-type substrate 144. Each transistor includes a stacked gate structure that consists of a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory cells (100, 102, 104 and 106) form the word lines. N+ doped layers 130, 132, 134, 136 and 138 are shared between neighboring cells, whereby the cells are connected to one another in series to form a NAND string. These N+ doped layers form the source and drain of each of the cells. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Each memory cell can store data represented in analog or digital form. When storing one bit of digital data, the range of possible threshold voltages of the memory cell is divided into two ranges, which are assigned logical data "1" and "0." In one example of a NAND-type flash memory, the voltage threshold is negative after the memory cell is erased, and defined as logic "1." The threshold voltage is positive after a program operation, and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory cell and the threshold voltage ranges of the cell depends upon the data encoding scheme adopted for the memory cells.

Other types of non-volatile memory in addition to NAND flash memory can also be used.

Another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, two bits are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric.

Figure 3:
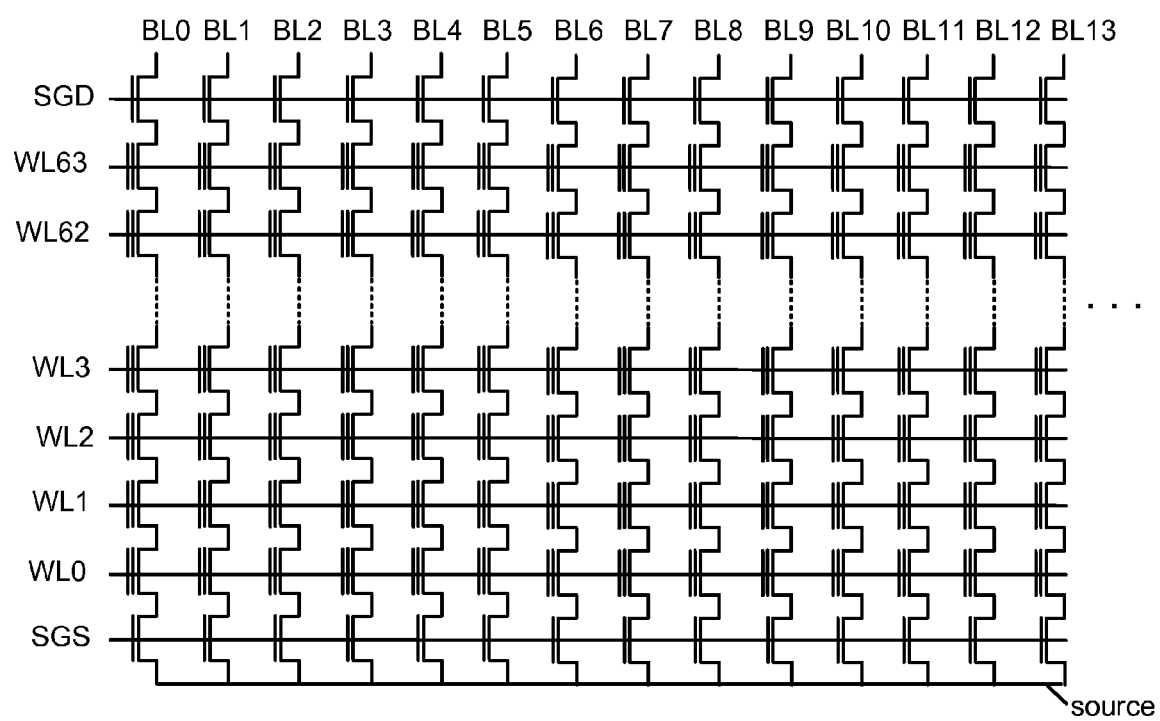
FIG. 3 depicts a block of NAND flash memory cells.

FIG. 3 depicts a block of NAND flash memory cells. The block includes a number of NAND strings and respective bit lines, e.g., BL0, BL1, . . . . Each NAND string is connected at one end to a drain select gate (SGD), and the control gates of the drain select gates are connected via a common SGD line. The NAND strings are connected at their other end to a source select gate which, in turn, is connected to a common source line. Sixty-four word lines, for example, WL0-WL63, extend between the source select gates and the drain select gates.

Figure 4:
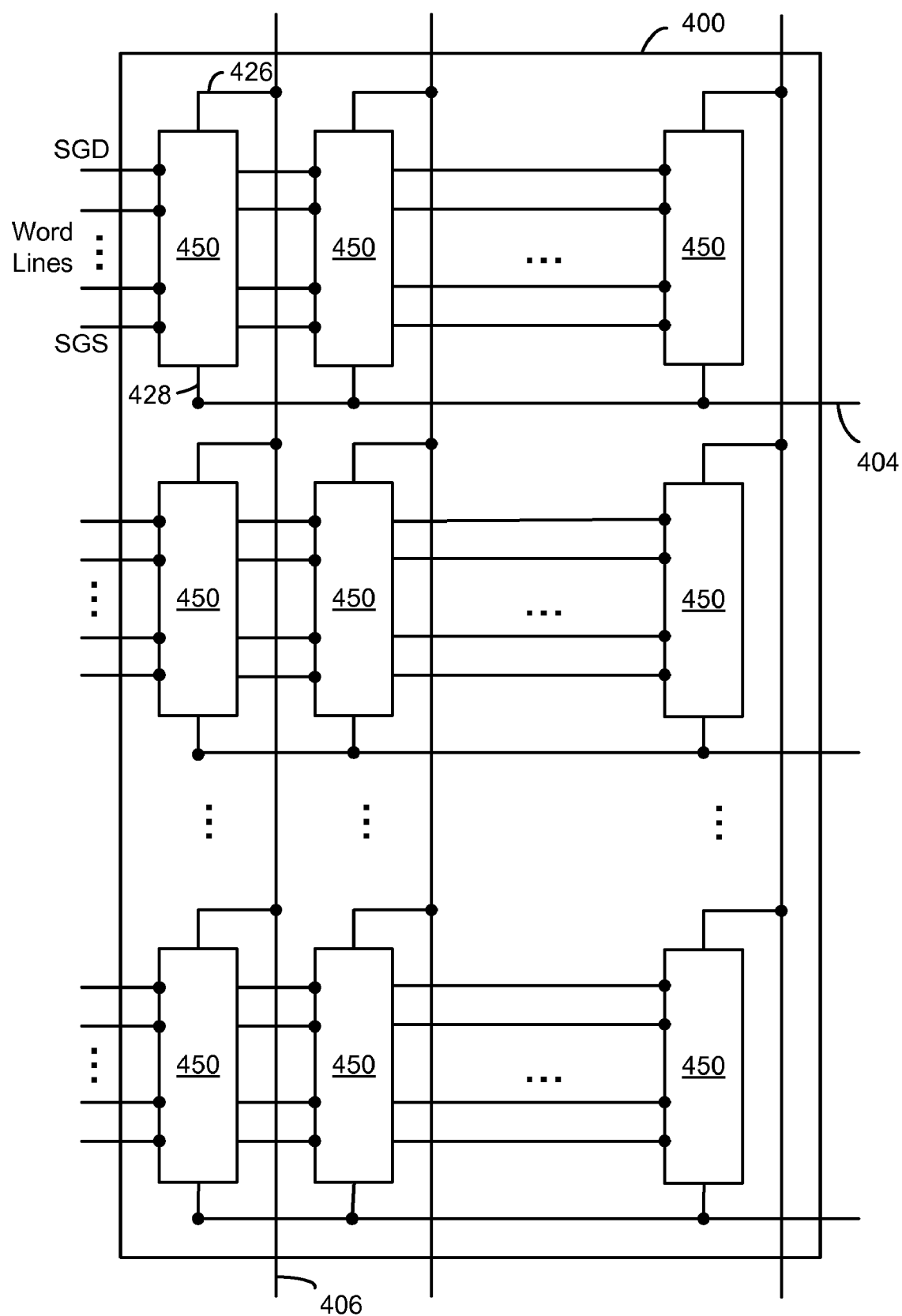
FIG. 4 is a block diagram of an array of NAND flash memory cells.

FIG. 4 illustrates an example of an array 400 of NAND cells, such as those shown in FIGS. 1a-2. Along each column, a bit line 406 is coupled to the drain terminal 426 of the drain select gate for the NAND string 450. Along each row of NAND strings, a source line 404 may connect all the source terminals 428 of the source select gates of the NAND strings.

The array of storage elements is divided into a large number of blocks of storage elements. As is common for flash EEPROM systems, the block is the unit of erase. That is, each block contains the minimum number of storage elements that are erased together. Each block is typically divided into a number of pages. A page is the smallest unit of programming. One or more pages of data are typically stored in one row of storage elements. For example, a row typically contains several interleaved pages or it may constitute one page. All storage elements of a page will be read or programmed together. Moreover, a page can store user data from one or more sectors. A sector is a logical concept used by the host as a convenient unit of user data; it typically does not contain overhead data, which is confined to the controller. Overhead data may include an Error Correction Code (ECC) that has been calculated from the user data of the sector. A portion of the controller (described below) calculates the ECC when data is being programmed into the array, and also checks it when data is being read from the array. Alternatively, the ECCs and/or other overhead data are stored in different pages, or even different blocks, than the user data to which they pertain.

A sector of user data is typically 512 bytes, corresponding to the size of a sector in magnetic disk drives. Overhead data is typically an additional 16-20 bytes. A large number of pages form a block, anywhere from 8 pages, for example, up to 32, 64 or more pages. In some embodiments, a row of NAND strings comprises a block.

Figure 5:
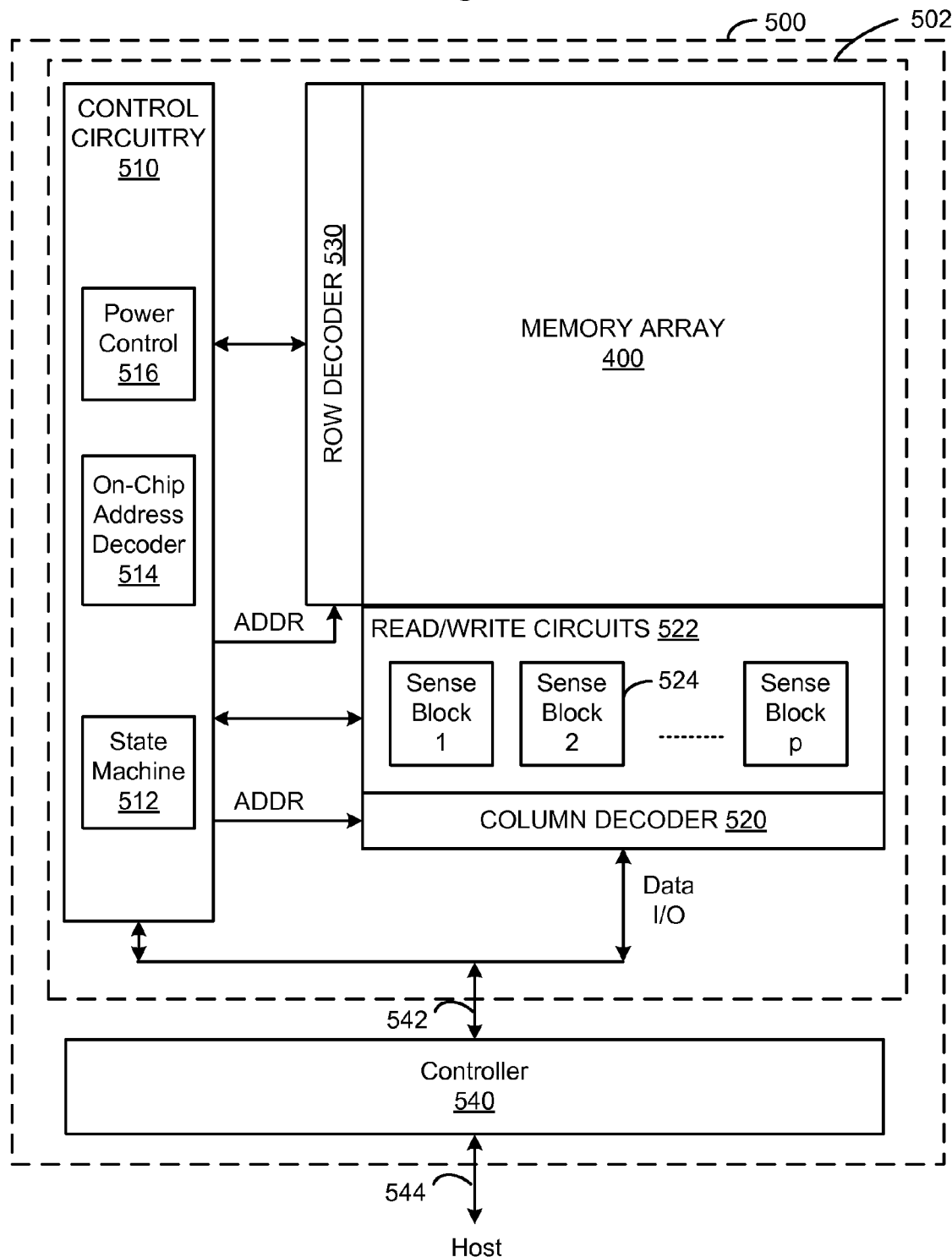
FIG. 5 is a block diagram of a non-volatile memory system.

FIG. 5 illustrates a memory device 500 having read/write circuits for reading and programming a page of memory cells in parallel, according to one embodiment. Memory device 500 may include one or more memory die 502. Memory die 502 includes a two-dimensional array of memory cells 400, control circuitry 510, and read/write circuits 522. The memory array 400 is addressable by word lines via a row decoder 530 and by bit lines via a column decoder 560. The read/write circuits 522 include multiple sense blocks 524 and allow a page of memory cells to be read or programmed in parallel. Typically, a controller 540 is included in the same memory device 500 (e.g., a removable storage card) as the one or more memory die 502. Commands and Data are transferred between the host and controller 540 via lines 544 and between the controller and the one or more memory die 502 via lines 542.

The control circuitry 510 cooperates with the read/write circuits 522 to perform memory operations on the memory array 400. The control circuitry 510 includes a state machine 512, an on-chip address decoder 514 and a power control module 516. The state machine 512 provides chip-level control of memory operations. The on-chip address decoder 514 provides an address interface between that used by the host or a memory controller to the hardware address used by the decoders 530 and 520. The power control module 516 controls the power and voltages supplied to the word lines and bit lines during memory operations.

In another approach, dual row/column decoders and read/write circuits are used. Access to the memory array 400 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 400. In this way, the density of the read/write modules is essentially reduced by one half.

Figure 6:
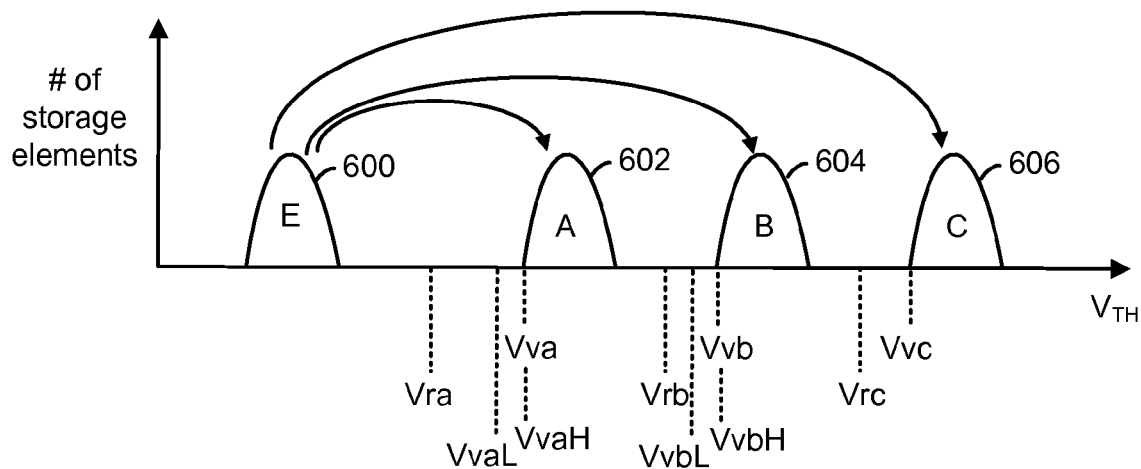
FIG. 6 depicts an example set of threshold voltage distributions and one-pass programming.

FIG. 6 depicts an example set of threshold voltage distributions and one-pass programming. Example threshold voltage distributions for the storage element array are provided for a case where each storage element stores two bits of data. A first threshold voltage distribution 600 is provided for erased (E state) storage elements. Three threshold voltage distributions 602, 604 and 606 represent programmed states A, B and C, respectively. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. Although four states are shown, the other multistate structures including those that include more or less than four states can also be used.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

Figure 7:
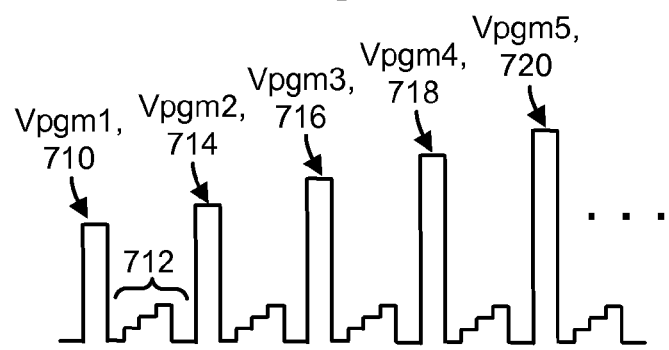
FIG. 7 depicts a voltage waveform applied to the control gates of storage elements during a program operation.

In one embodiment, known as full sequence programming, storage elements can be programmed from the erase state E directly to any of the programmed states A, B or C. For example, a population of storage elements to be programmed may first be erased so that all storage elements in the population are in erased state E. A series of program pulses such as depicted in FIG. 7 will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn-1 reaches a maximum since the change in amount of charge on the floating gate under WLn is the largest as compared to the change in charge when programming from state E to state A or state E to state B. When programming from state E to state B the amount of coupling to the adjacent floating gate is less. When programming from state E to state A the amount of coupling is reduced even further.

Another option is to use low and high verify levels for one or more data states. For example, VvaL and VvaH are lower and higher verify levels, respectively, for the A state, and VvbL and VvbH are lower and higher verify levels, respectively, for the B state. During programming, when the threshold voltage of a storage element which is being programmed to the A state as a target state exceeds VvaL, the programming speed of the storage element is slowed down from a full speed to a partial speed, such as by raising the associated bit line voltage to a level which is between a program or non-inhibit level and a full inhibit level. Raising the bit line voltage in turn raises the voltage of the channel of the associated NAND string. This provides greater accuracy by avoiding large step increases in threshold voltage. Raising the bit line voltage has the same effect as lowering the program pulse step size. At the same time, storage elements on other NAND strings can be programmed at full speed, receiving the full effect of the step size. When the threshold voltage reaches VvaH, the storage element is locked out from further programming. Similarly, when the threshold voltage of a storage element which is being programmed to the B state as a target state exceeds VvbL, the programming speed of the storage element is slowed down, and when the threshold voltage reaches VvbH, the storage element is locked out from further programming. This programming technique has been referred to as a quick pass write or dual verify technique. Note that, in one approach, dual verify levels are not used for the highest state, e.g., the C state, since some overshoot is typically acceptable. Instead, the dual verify levels can be used for the programmed states which are above the erased state and below the highest state, for instance.

FIG. 7 depicts a voltage waveform applied to the control gates of storage elements during a program operation. The waveform or pulse train includes program pulses 710, 714, 716, 718 and 720 . . . which step up in amplitude by a step size, and a set of verify pulses between each program pulse, including example verify pulses 712, such as Vva, Vvb and Vvc, or VvaL, VvaH, VvbL, VvbH, and Vvc, e.g., as discussed in connection with FIG. 6. The program pulses can be fixed in amplitude, or they can step up at a fixed or varying rate, for instance.

In one embodiment, the programming pulses have a voltage which starts at an initial level such as 12 V and increases by increments, e.g., 0.5 V, for each successive programming pulse until a maximum of, e.g., 20-25 V is reached. In some embodiments, there can be a verify pulse for each state that data is being programmed into, e.g., state A, B and C. In other embodiments, there can be more or fewer verify pulses. The waveform may be used during all bit line programming, for instance, in which storage elements of even- and odd-numbered bit lines are programmed together, and verified together. Or, the verify operation can be performed separately, e.g., first for the even-numbered bit lines and then for the odd-numbered bit lines.

Figure 8:
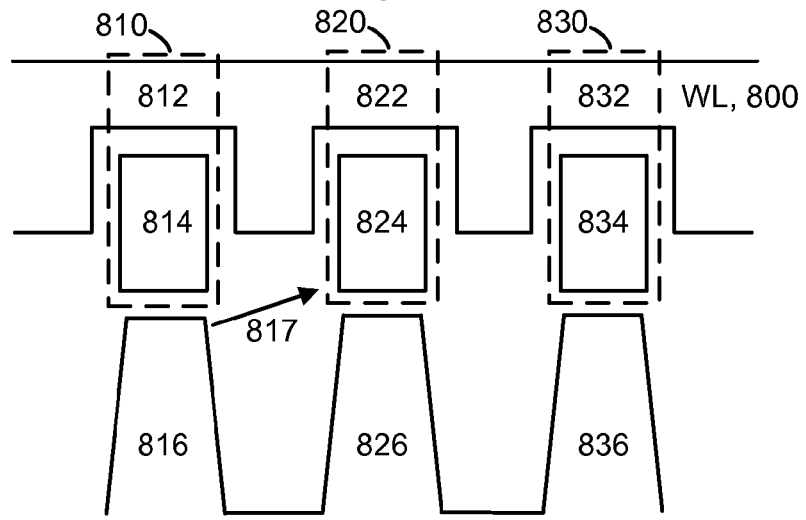
FIG. 8 is a cross section of NAND strings, and depicts channel boosting.

FIG. 8 is a cross section of NAND strings, and depicts channel boosting. The cross section depicts a control gate (CG) or selected word line 800 which extends across multiple storage elements in a word line direction. Each storage element includes a control gate and a floating gate (FG) which is over a respective channel area of the substrate, typically in a p-well. For example, a storage element 810 includes a control gate 812 and a floating gate 814 over a channel region 816, a storage element 820 includes a control gate 822 and a floating gate 824 over a channel region 826, and a storage element 830 includes a control gate 832 and a floating gate 834 over a channel region 836. Each channel region is part of a NAND string which can be visualized as coming out of the page, in a bit line direction which is orthogonal to the word line direction.

As mentioned at the outset and in connection with FIG. 6, the channel of a storage element which has completed programming is inhibited when subsequent program iterations are performed to avoid further programming of these storage elements. For example, assume that the storage element 810 is being inhibited. In this case, the channel region 816 can be elevated or boosted to several Volts by raising the associated bit line voltage. Such boosting inhibits programming of the floating gate 814, when a program voltage is applied to the word line 800, by reducing the voltage across the floating gate 814. Assume also that the storage element 820 is still being programmed. Channel-to-floating gate coupling represented by arrow 817 will tend to raise the potential of the floating gate 824 if the channel 826 is kept at a fixed voltage such as 0 V. When a program voltage is applied to the word line 800, the potential of the floating gate 824 will increase further. However, the total programming voltage which is seen by the floating gate 824 is larger than intended because of the coupling 817 so that the floating gate 824 will be programmed to a higher threshold voltage than intended. For example, if a program voltage with a step size of 0.2 V is applied to the word line 800, due to the coupling from the channel 816, the potential of the floating gate 824 may increase by an amount which would be expected if the step size was higher, such as 0.3 V, and there was no coupling from the channel 816. Coupling from the channel region 836 can similarly inadvertently increase the potential of the floating gate 824 so that it is programmed faster than expected. This results in widening of the threshold voltage distribution for a set of storage elements. This is mainly a concern in an all bit line programming technique where adjacent bit lines/NAND strings are concurrently programmed.

As mentioned, channel-to-floating gate coupling can occur from one or both adjacent channels of a floating gate, e.g., channel 816 and/or 836 of floating gate 824. Coupling from channels which are not adjacent to a floating gate is much less than from adjacent channels, and is a second order effect which is not compensated.

To counteract such channel-to-floating gate coupling, the channel 826 of the storage element which is still being programmed can be floated while the adjacent storage element 810 is inhibited. However, this would preclude the use of partial-speed programming, such as discussed in connection with FIG. 6. One programming technique described herein allows the channels of storage elements which are still being programmed to be raised to desired levels which provide partial speed or full speed programming.

Figure 10A:
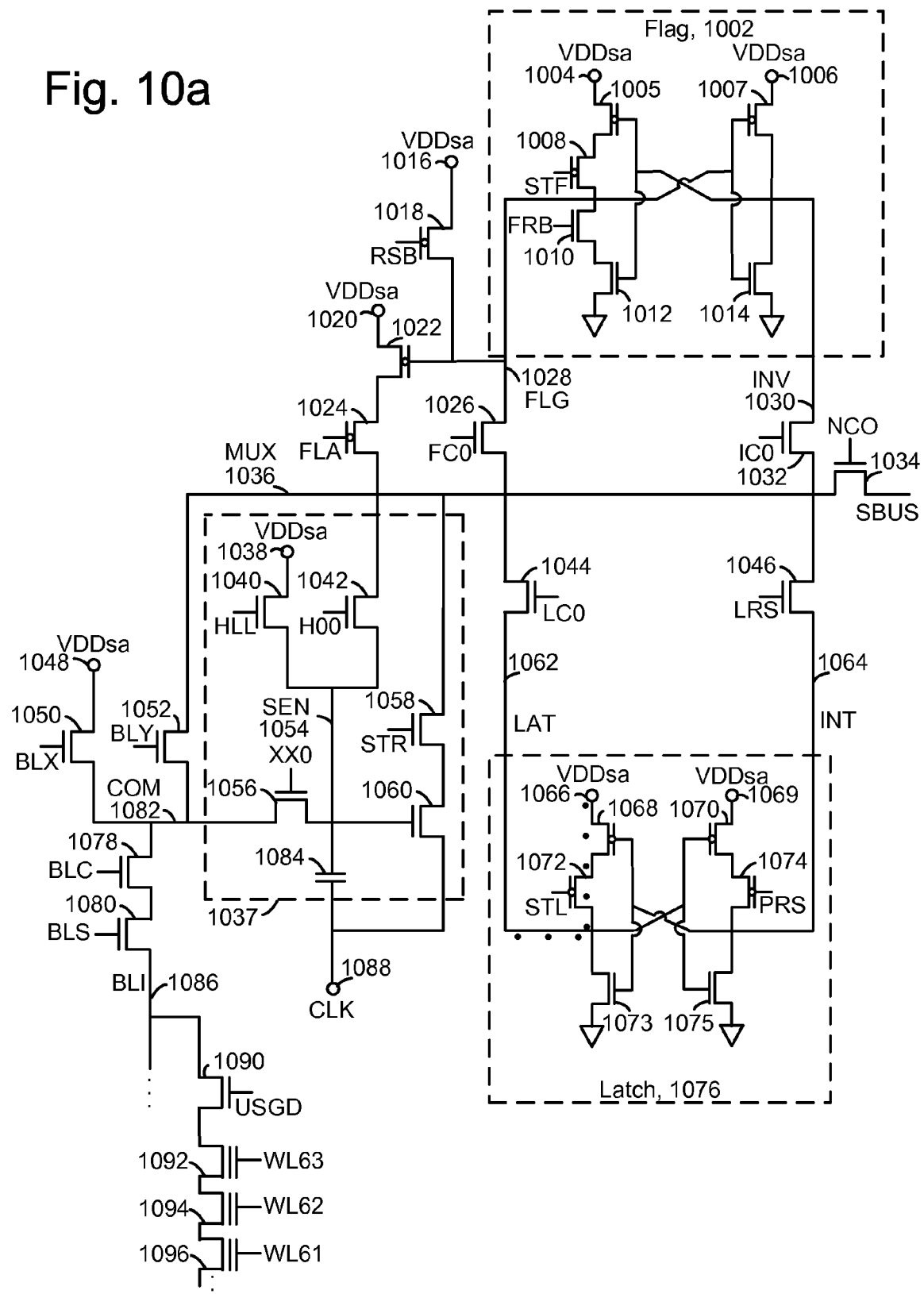
FIG. 10a depicts one example implementation of a circuit for use in a program operation.
Figure 10B:
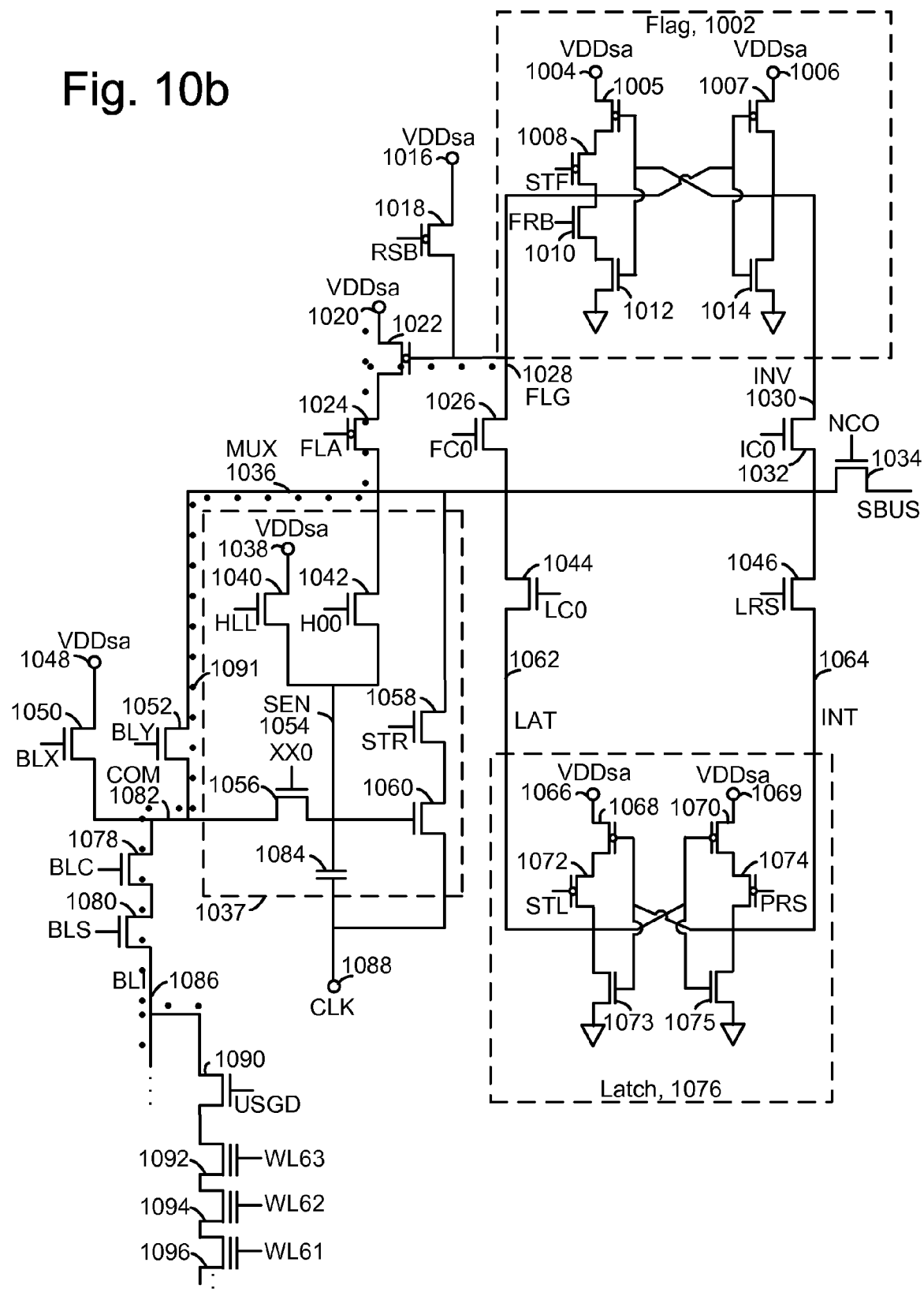
FIG. 10b depicts the circuit of FIG. 10a configured for use with an inhibited bit line.

FIG. 9 depicts a time line of a program operation for use with the circuit of FIG. 10a, which depicts one example implementation of a circuit for use in a program operation. A separate copy of the circuit of FIG. 10a can be provided for each bit line, and the circuit of FIG. 10a is configured differently for the associated bit line according to whether the bit line is inhibited from programming (see FIG. 10b), undergoes full speed programming (see FIG. 10c) or undergoes partial speed programming (see FIG. 10d), in the current program iteration. One or more control circuits can communicate commands to each circuit to configure the circuit. The time line extends over a single iteration of a program operation which encompasses multiple iterations. Furthermore, a verify operation (not depicted) can follow the period encompassed by the time line.

Waveform 900 depicts the voltage of a bit line or channel of a NAND string or other series-connected string of storage elements which includes a selected storage element being programmed at a full speed. Waveform 902 depicts the voltage of a bit line or channel of a NAND string or other series-connected string of storage elements which includes a selected storage element which is inhibited, e.g., fully inhibited, or stopped, from being programmed. Waveform 904 depicts the voltage of a bit line or channel of a NAND string or other series-connected string of storage elements which includes a selected storage element being programmed at a partial speed (also referred to as partially inhibited speed). Waveform 906 depicts a voltage VWL on the selected word line. A two-part program pulse is provided at t6-t7. Waveform 908 depicts a voltage applied to a USGD transistor 1090 in FIG. 10a. This is a select gate drain transistor which is controlled to allow a bit line to communicate with control circuitry. Waveform 910 depicts a voltage applied to a high voltage BLS transistor BLS 1080 in FIG. 10a. Waveform 912 depicts a voltage applied to a low voltage BLC transistor 1078 in FIG. 10*a*. Waveform 914 depicts a voltage applied to a BLY transistor 1052 in FIG. 10*a*.

Waveform 916 depicts a voltage applied to an FLA transistor 1024 in FIG. 10*a*. Waveform 918 depicts a voltage applied to an ICO transistor 1032 in FIG. 10. Waveform 920 depicts a voltage applied to an RSB transistor 1018 in FIG. 10*a*. RSB provides a reset signal at the end of a program pulse to set FLG high. Waveform 922 depicts a voltage applied to an LCO transistor 1044 in FIG. 10*a*.

Vertical lines denoted t0-t10 represent time points during the program iteration.

The time period t1-t3 represents a boosting or pre-charge period. For an inhibited bit line, see FIG. 10*b*. Initially, at t1, BLinhibit is raised or pre-charged from 0 V to a specified level of Vddsa-ΔV, where Vddsa is a supply power which is sufficiently high to perform the boosting herein. In other words, BLinhibit is raised to a level which is ΔV below a final level of Vddsa which is desired to be achieved when a program pulse is applied to the selected word line. ΔV is a design parameter which can be optimally set for a particular type of memory device. ΔV can be optimized on silicon to achieve the maximum compensation.

Generally, for the inhibited bit line, from t1-t3, BLinhibit is raised by enabling a conductive path through transistors FLA 1024 and BLC 1078 as depicted by the dotted path 1091. The FLG path 1028 at the output of the flag circuit 1002 is set to low and the LAT path 1062 is set to high.

Specifically, VWL (waveform 906) is fixed at 0 V since this is a pre-charge phase, prior to when the program pulse is applied. USGD (waveform 908) is fixed at 0 V so that the USGD transistor 1090 is non-conductive, allowing a charge to be built up in the bit line 1086. BLS (waveform 910) is raised to a level which is sufficient to pass a voltage from BLC to the bit line 1086. BLC (waveform 912) is raised to Vddsa-ΔV+Vth, where Vth is the threshold voltage of the BLC transistor 1078. As a result, an output of the BLC transistor 1078 which is passed to the bit line 1086 via the BLS transistor 1080 is Vddsa-ΔV.

BLY (waveform 914) is raised to the threshold voltage (Vth) of the BLY transistor 1052 plus Vddsa so that Vddsa is on the COM path 1082. FLA (waveform 916) is dropped from Vddsa to 0 V, making the FLA transistor 1024, a pMOS, conductive. ICO (waveform 918) is raised from 0 V to a level which connects the MUX path 1036 and the INV path 1030 of a flag circuit 1002. This sets BLprogram-full speed and BLprogram-partial speed to 0 V. RSB (waveform 920) is fixed at Vddsa so that the RSB transistor 1018, a PMOS, is non-conductive. LCO (waveform 922) is fixed at 0 V so that the LAT path 1062 is decoupled from MUX path 1036.

Figure 11:
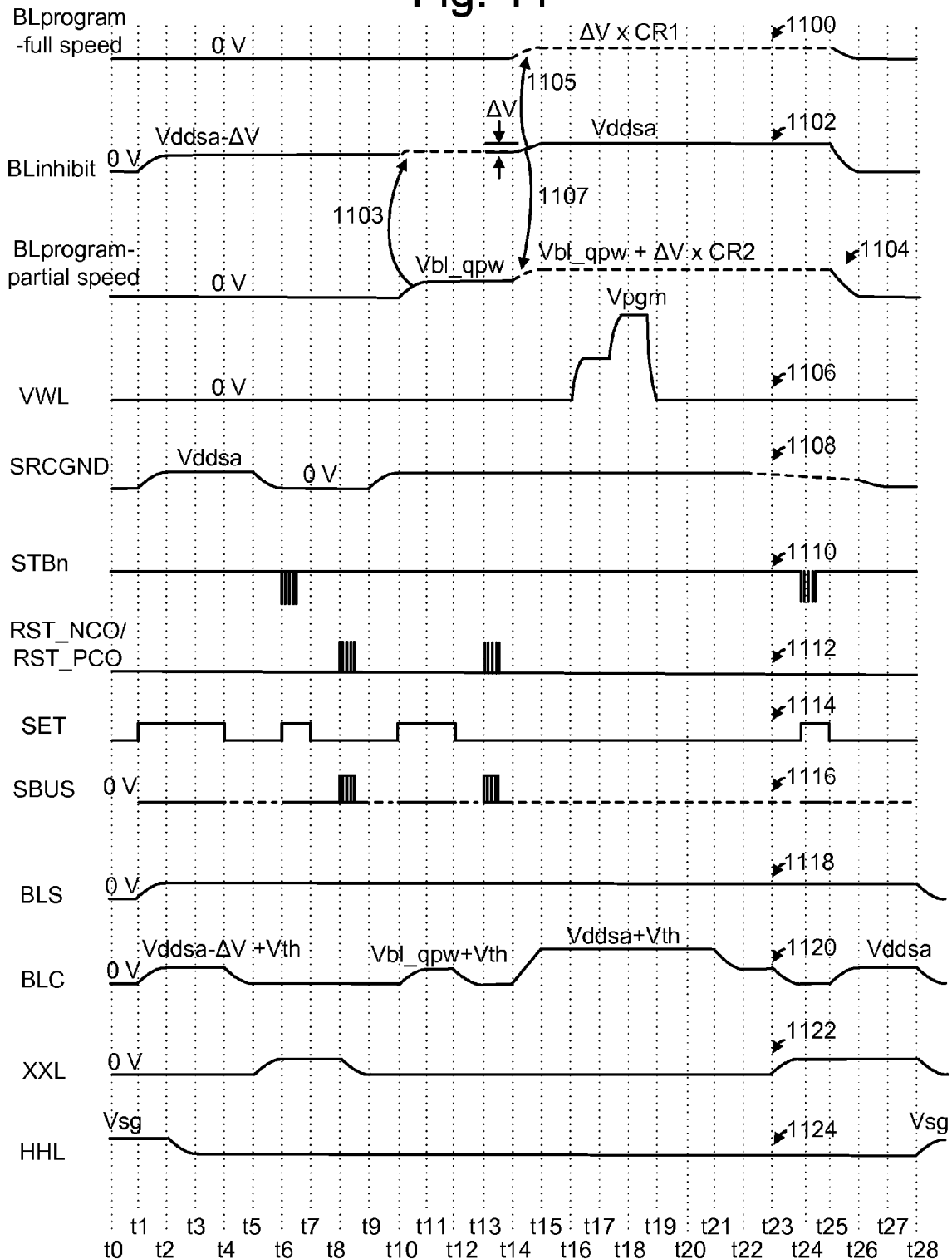

For the inhibited bit line, from t3-t4, BLinhibit is floated. In FIGS. 9 and 11, the dotted lines refer to a floating voltage. In this time period, BLinhibit may be temporarily coupled higher by an increase in the voltage of an adjacent bit line. For example, if an adjacent bit line is subject to partial speed programming, as depicted by BLprogram-partial speed, that bit line experiences an increase in voltage from 0 V to a level referred to as Vbl_qpw, as discussed further below. This causes coupling, represented by an arrow 903, to BLinhibit. The potential of the inhibited bit line thus floats higher for a moment and then decays back toward the previous level of Vddsa-ΔV. By floating the inhibit bit line from t3-t4, we ensure that BLinhibit is not affected by coupling from BLprogram-partial speed. Also, from t3-t4, USGD is raised to Vdd, a different supply voltage than Vddsa, but at the same level, in one approach. This allows the extra charge which has been coupled to BLinhibit to be discharged to an unselected block channel by enabling USGD. This discharge results in the decay of BLinhibit to Vddsa-ΔV.

From t4-t5, BLinhibit is again driven at Vddsa-ΔV. From t5-t8, BLinhibit is driven at a higher level, Vddsa, so that it is driven higher by an increment of ΔV. Specifically, at t5, BLC (waveform 912) is raised from Vddsa-ΔV+Vth to Vddsa+Vth, an increase of ΔV, thereby causing an increase in BLinhibit of ΔV. From t8-t9, BLinhibit is floated. At t8, BLinhibit is discharged to 0 V.

BLprogram-full speed (waveform 900) is at 0 V from t1-t5, including when BLprogram-partial speed (waveform 904) is raised at t3-t4. BLprogram-full speed may experience a small temporary increase or blip at t1. BLprogram-full speed is floated from t5-t9, so that it is coupled higher to a level which is based on ΔV and a coupling ratio CR1, as represented by an arrow 905. The amount of coupling depends on how close the BLprogram-full speed bit line is to the BLinhibit bit line. Coupling is strongest when the bit lines or the associated channels are adjacent. At t8, BLprogram-full speed is discharged to 0 V.

Figure 10C:
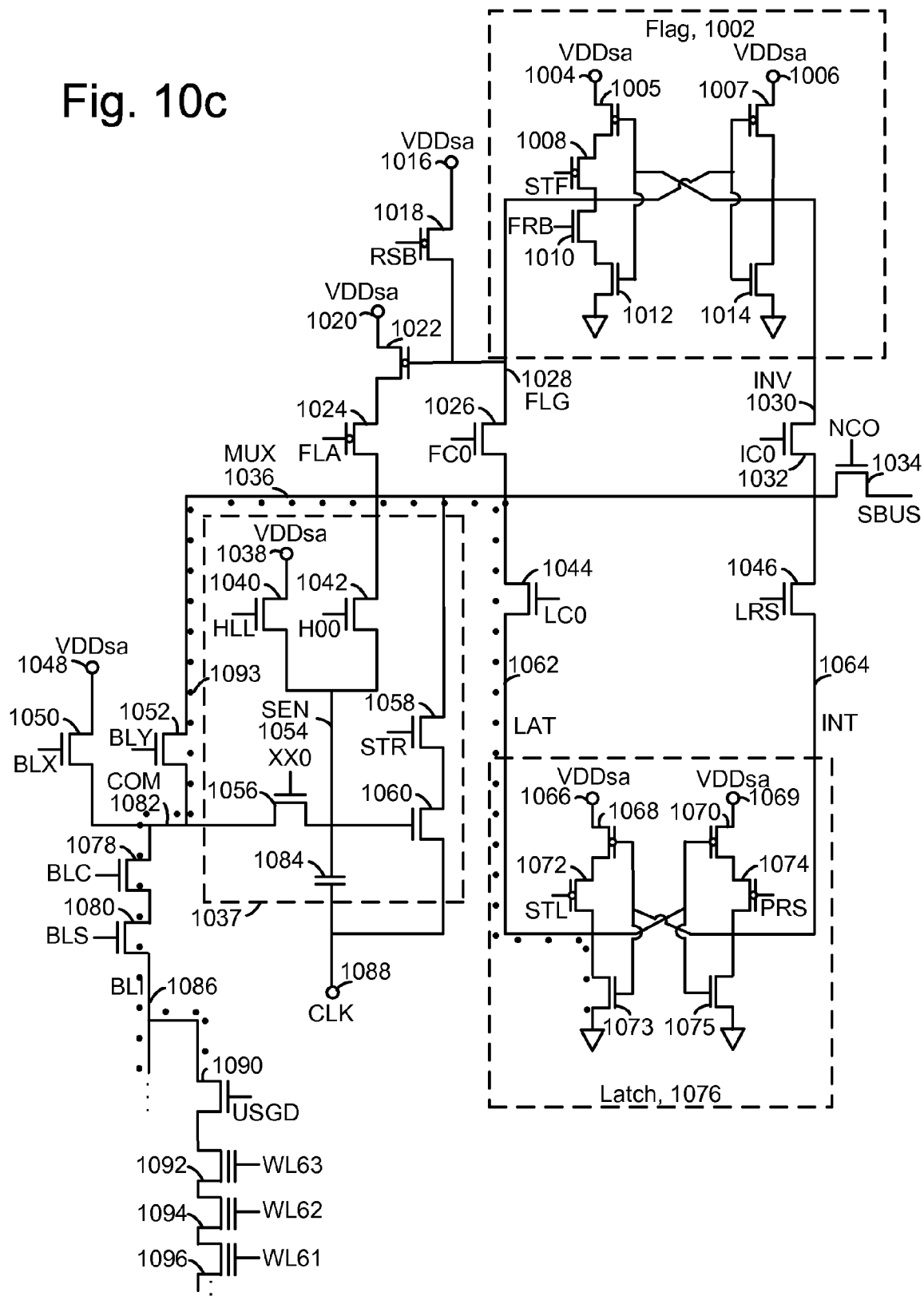
FIG. 10c depicts the circuit of FIG. 10a configured for use with a full speed programmed bit line.

In particular, the FLG path 1028 at the output of the flag circuit 1002 is set to high and the LAT path 1062 is set to low. By setting FLG high, transistor 1022 is non-conductive. By setting LAT low, transistor 1044 is conductive, so that a conductive path to ground is provided as indicated by the dotted path 1093 (FIG. 10*c*).

BLprogram-partial speed (waveform 904) is at 0 V from t1-t2, and floated from t2-t3 by making the LCO transistor 1044 (waveform 922) non-conductive. BLprogram-partial speed is raised at t3-t5 from 0 V to Vbl_qpw, which is the desired level which provides partial speed (quick pass write or qpw) programming for the associated bit line. This is achieved by raising the LCO transistor 1044 (FIG. 10*d*) from 0 V to Vbl_qpw+Vth from t3-t5. BLprogram-partial speed may experience a small temporary increase or blip at t1. BLprogram-partial speed is floated from t5-t9, so that it is coupled higher to a level which is based on ΔV and a coupling ratio CR2, as represented by an arrow 907. CR2 may equal CR1. The amount of coupling depends on how close the BLprogram-partial speed bit line is to the BLinhibit bit line. Coupling is strongest when the bit lines or the associated channels are adjacent. At t8, BLprogram-partial is discharged to 0 V.

Figure 10D:
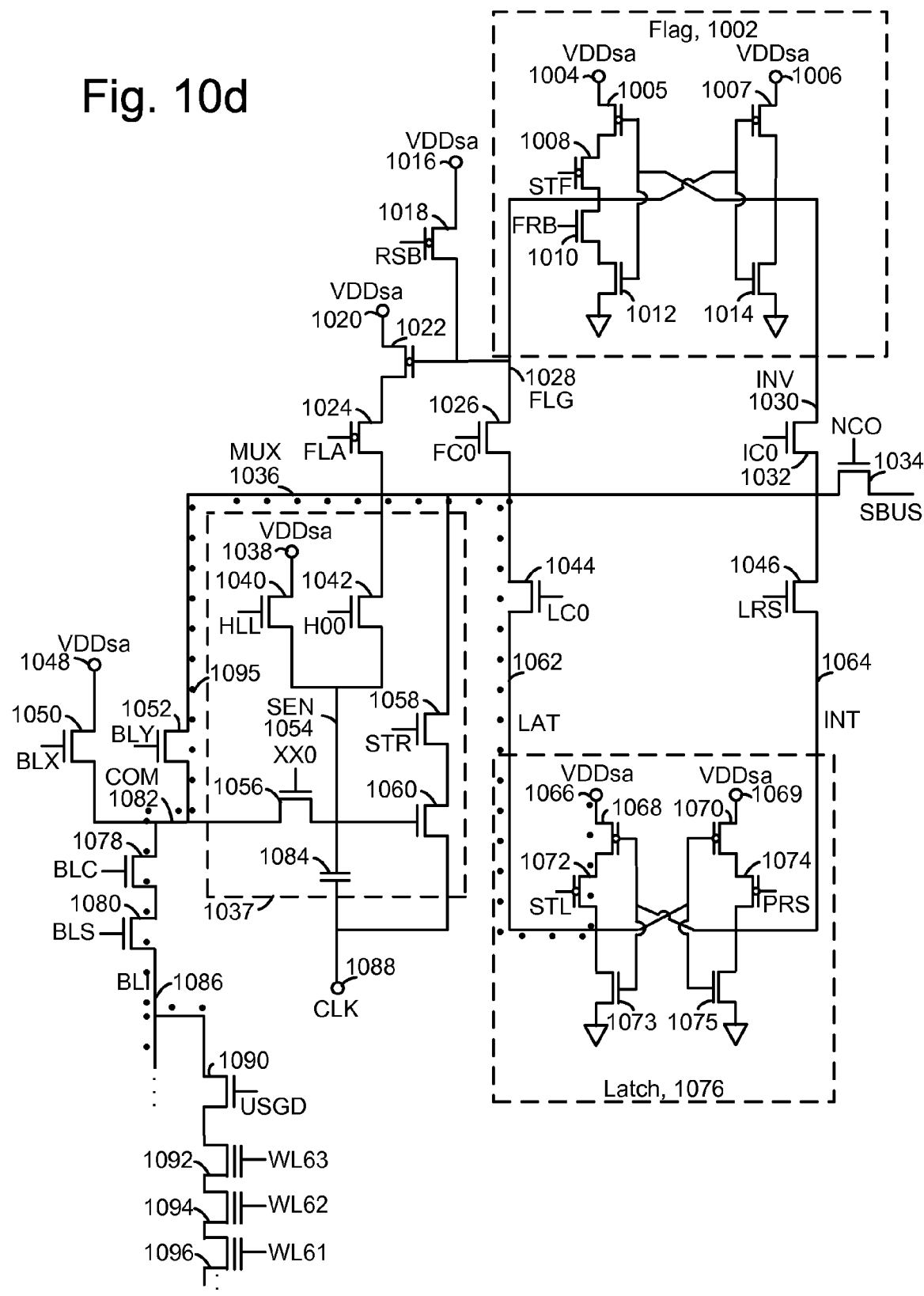
FIG. 10d depicts the circuit of FIG. 10a configured for use with a partial speed programmed bit line.

In particular, the FLG path 1028 at the output of the flag circuit 1002 is set to high and the LAT path 1062 is set to high. By setting FLG high, transistor 1022 is non-conductive. By setting LAT high, transistor 1044 is also non-conductive, so that a conductive path from a power supply node 1068 is provided as indicated by the dotted path 1095 (FIG. 10*d*). The output of the LCO transistor 1044, which is communicated to the bit line 1086, is Vbl_qpw.

Transistors BLX 1050, XX0 1056, HLL 1040 and H00 1042 and clock node CLK 1088 are fixed at 0 V during the program iteration.

Thus, the programming iteration can be summarized as follows:

| Pattern: | Full speed program | Partial speed program | Inhibit |
|---|---|---|---|
| BL | Vss | Vblc_qpw | Vddsa |
| FLG | High | High | Low |
| LAT | Low | High | High |

FIG. 10*a* depicts one example implementation of a circuit for use in a program operation. The transistors depicted can be MOSFETS or pMOSFETs. pMOSs are identified by a transistor symbol with a circle. A flag circuit 1002 sets a flag FLG on path 1028 to high or low. INV on path 1030 is the inverse of FLG. Nodes 1004 and 1006 receive a local power supply Vddsa, or Vdd for a sense amp. STF transistor 1008 and FRB transistor 1010 receive appropriate control signals to provide the desired FLG level. A gate of transistor 1005 is connected to a transistor 1012 of a ground path. Similarly, a gate of transistor 1007 is connected to a transistor 1014 of a ground path.

With FLG high, transistor 1022 is non-conductive. Transistor 1022, when conductive, couples a power supply terminal 1020 to a FLA transistor 1024.

An NCO transistor 1034 connects the MUX path 1036 to a sense bus (SBUS) for input and output of data. An ICO transistor 1032 controls whether the INV path 1030 communicates with the MUX path 1036. An FCO transistor 1026 controls whether the FLG path 1028 communicates with the MUX path 1036.

A reset or RSB transistor 1018 controls whether a power supply node 1016 communicates with the FLG path 1028.

A latch circuit 1076 sets a flag LAT on path 1062 to high or low. INT on path 1064 is the inverse of LAT.

Nodes 1066 and 1069 receive Vddsa. STL transistor 1072 and PRS transistor 1074 receive appropriate control signals to provide the desired LAT level. A gate of transistor 1068 is connected to a transistor 1073 of a ground path. Similarly, a gate of transistor 1070 is connected to a transistor 1075 of a ground path.

An LCO transistor 1044 controls whether the LAT path 1062 communicates with the MUX path 1036. An LRS transistor 1046 controls whether the INT path 1064 communicates with the MUX path 1036.

A sense circuit 1037, which is used during a verify or read operation, includes a sense path 1054, a XX0 transistor which controls whether the sense path communicates with the COM path 1082, an HLL transistor 1040 which controls whether the sense path communicates with a power supply node 1038, and an H00 transistor 1042 which controls whether the sense path communicates with the MUX path 1036. The SEN path 1054 is coupled to a control gate of a transistor 1060, and an STR transistor 1058 controls whether the transistor 1060 communicates with the MUX path 1036. A clock CLK signal is provided at a node 1088 to a capacitor 1084.

A BLY transistor 1052 controls whether the MUX path 1036 communicates with the COM path 1082, while a BLX transistor 1050 controls whether the COM path 1082 communicates with a power supply node 1048. The BLC transistor 1078 and BLS transistor 1080 control whether the COM path 1082 communicates with the bit line BLI 1086. The bit line 1086 may communicate with one or more NAND strings. An example NAND string includes a drain select gate USGD 1090 and storage elements 1092, 1094 and 1096 whose control gates communicate with word lines WL63, WL62 and WL61, respectively, for example.

The circuit of FIG. 10*a* is one possible embodiment. Other variations are possible.

Figure 12A:
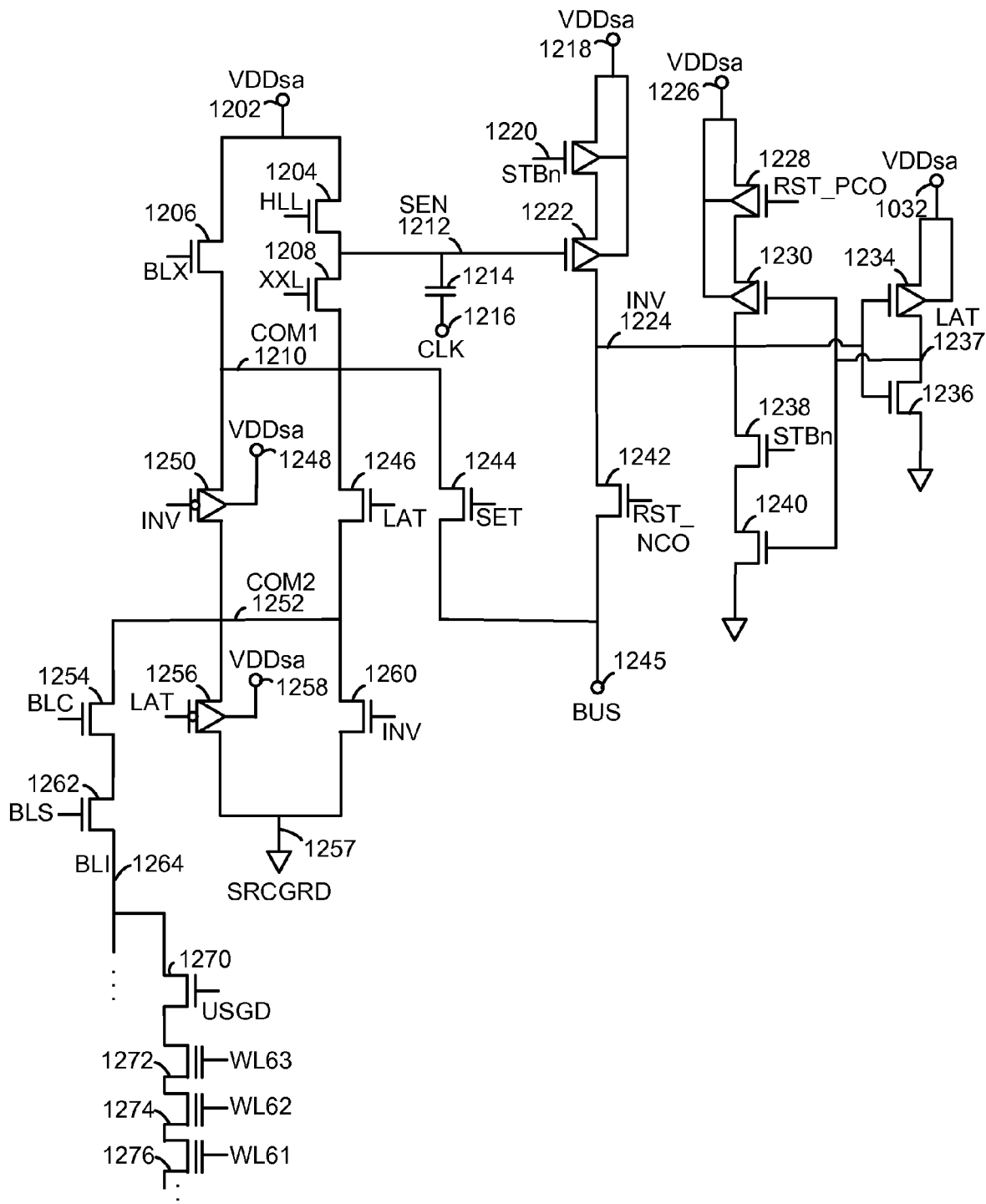
FIG. 12a depicts another example implementation of a circuit for use in a program operation.

For example, FIG. 11 depicts a time line of a program operation for use with the circuit of FIG. 12*a*.

Figure 12B:
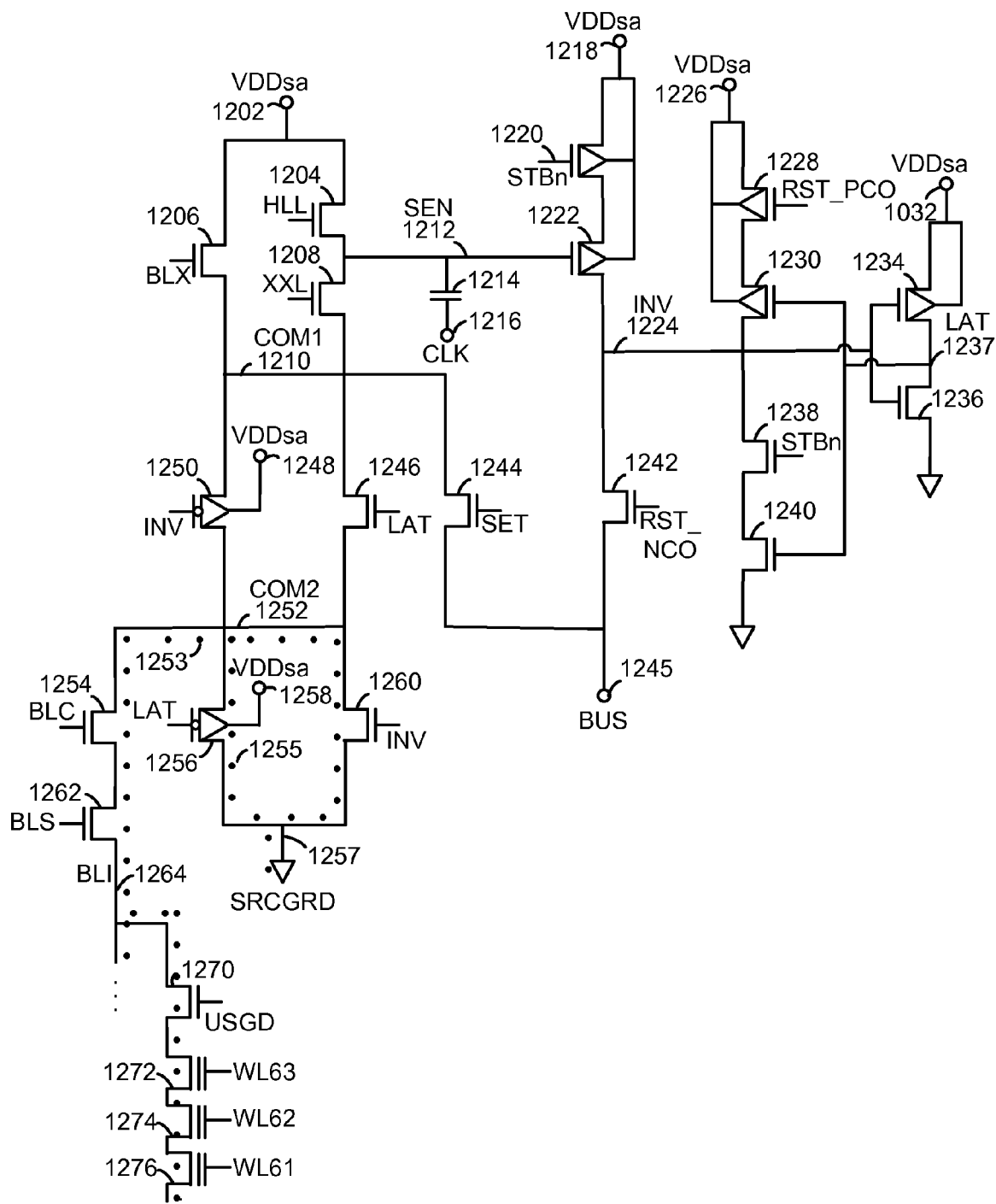
FIG. 12b depicts the circuit of FIG. 12a in a configuration for an inhibited bit line, and for a partially inhibited, or partial speed programmed bit line during t10-t14 in FIG. 11.
Figure 12C:
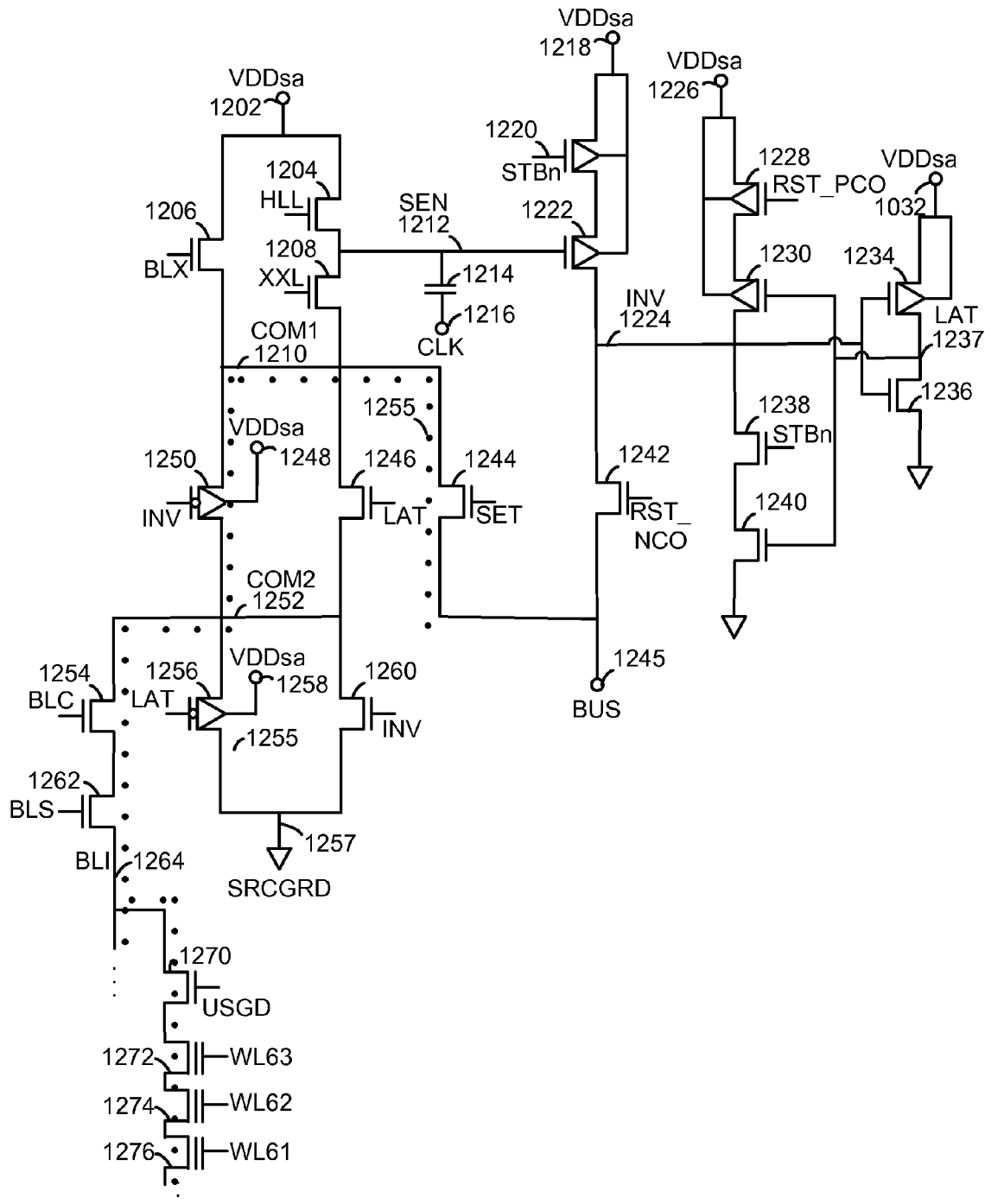
FIG. 12c depicts the circuit of FIG. 12a in a configuration for an uninhibited, full speed programmed bit line, and for a partially inhibited, or partial speed programmed bit line outside t10-t14 in FIG. 11.

A separate copy of the circuit of FIG. 12*a* can be provided for each bit line, and the circuit of FIG. 12*a* is configured differently for the associated bit line according to whether the bit line is inhibited from programming undergoes full speed programming or undergoes partial speed programming, in the current program iteration. Specifically, FIG. 12*b* depicts the circuit of FIG. 12*a* in a configuration for an inhibited bit line. It also depicts the circuit of FIG. 12*a* in a configuration for a partially inhibited, or partial speed programmed bit line during t10-t14 in FIG. 11. FIG. 12*c* depicts the circuit of FIG. 12*a* in a configuration for an uninhibited, full speed programmed bit line. It also depicts the circuit of FIG. 12*a* in a configuration for a partially inhibited, or partial speed programmed bit line outside t10-t14 in FIG. 11. The time line extends over a single iteration of a program operation which encompasses multiple iterations. Furthermore, a verify operation (not depicted) can follow the period encompassed by the time line.

Waveform 1100 depicts the voltage of a bit line or channel of a NAND string or other series-connected string of storage elements which includes a selected storage element being programmed at a full speed. Waveform 1102 depicts the voltage of a bit line or channel of a NAND string or other series-connected string of storage elements which includes a selected storage element which is inhibited, e.g., fully inhibited, or stopped from being programmed. Waveform 1104 depicts the voltage of a bit line or channel of a NAND string or other series-connected string of storage elements which includes a selected storage element being programmed at a partial speed (also referred to as partially inhibited speed). Waveform 1106 depicts a voltage VWL on the selected word line. A two-part program pulse is provided at t16-t19. Waveform 1108 depicts a voltage applied to a source ground (SRCGND) node 1257 in FIG. 12*a*. Waveform 1110 depicts a voltage applied to strobe node (STBn) 1220 or 1238. Waveform 1112 is applied to reset transistors 1228 and 1242 in FIG. 12*a*. Waveform 1114 is applied to a SET transistor 1244 in FIG. 12*a*. The SBUS waveform 1116 is applied to bus node 1245 in FIG. 12*a*. This waveform is driven when scanning in data, similar to waveform 1112 between t8-t9 and t13-t14. It is firmly set to ground whenever SET is high. At other times, it is floating as indicated by the dashed lines, most likely at or near 0 V. Waveform 1118 is applied to a BLS transistor 1262 in FIG. 12*a*. The transistor is discharged at t28. Waveform 1120 is applied to a BLC transistor 1254 in FIG. 12*a*. Waveform 1122 is applied to an XXL transistor 1208 in FIG. 12*a*. Waveform 1124 is applied to an HLL transistor 1204 in FIG. 12*a*.

Vertical lines denoted t0-t28 represent time points during the program iteration. The time scale does not necessarily correspond to that of FIG. 9.

The time period t1-t10 represents a boosting or pre-charge period. Initially, at t1, BLinhibit is raised or pre-charged from 0 V to Vddsa-ΔV. Generally, for the inhibited bit line, from t1-t10, BLinhibit is raised by enabling a conductive path through transistors LAT 1256 and INV 1260 from SRCGRD 1257, as depicted by the dotted path 1253 (FIG. 12*b*). LAT is set to low (0) and INV is set to high (1). Transistors 1246 and 1250 are off.

Specifically, VWL (waveform 1106) is fixed at 0 V since this is a pre-charge phase, prior to when the program pulse is applied. BLS (waveform 1118) is raised to a level which is sufficient to pass a voltage from BLC to the bit line 1264. BLC (waveform 1120) is raised to Vddsa-ΔV+Vth, where Vth is the threshold voltage of the BLC transistor 1254. As a result, an output of the BLC transistor 1254 which is passed to the bit line 1264 via the BLS transistor 1262 is Vddsa-ΔV.

For the inhibited bit line, from t10-t13, BLinhibit is floated. In this time period, BLinhibit may be coupled higher by an increase in the voltage of an adjacent bit line. For example, if an adjacent bit line is subject to partial speed programming, as depicted by BLprogram-partial speed, that bit line experiences an increase in voltage from 0 V to a level referred to as Vbl_qpw. This causes coupling, represented by an arrow 1103, to BLinhibit. Since BLinhibit is charged from an NMOS (BLC transistor 1254) when it floats higher it does not decay, ignoring a tiny junction leakage. That is, BLinhibit 1102 does not decay from t10-t14 because BLC is lower from t10-t14 than during t1-t4 (i.e., Vbl_qpw<Vddsa-ΔV). This is the case, e.g., when Vddsa-ΔV is about 2 V and Vbl_qpw is about 0.6 V. The coupling of BLinhibit, or coupling error, is not large, with Vbl_qpw of about 0.6 V, and we can cut this error in half by setting Vddsa-ΔV a little bit lower. From t13-t14, BLinhibit is again driven at Vddsa-ΔV. From t14-t21, BLinhibit is driven at a higher level, Vddsa, so that it is driven higher by an increment of ΔV.

Specifically, from t1-t4, BLC (waveform 1120) is raised from 0 V to Vddsa-ΔV+Vth, thereby driving BLinhibit at Vddsa-ΔV. From t10-t12, BLC (waveform 1120) is raised from 0 V to Vbl_qpw+Vth, thereby driving BLprogram-partial speed at Vbl_qpw. From t14-t21, BLC (waveform 1120) is raised from 0 V to Vddsa+Vth, thereby driving BLinhibit at Vddsa. At t25, all bit lines are discharged to 0 V when BLC increases to Vddsa.

BLprogram-full speed is floated from t14-t21, so that it is coupled higher to a level which is based on ΔV and a coupling ratio CR1, as represented by an arrow 1105. BLprogram-partial speed is also floated from t14-t21, so that it is coupled higher to a level which is based on ΔV and a coupling ratio CR2, as represented by an arrow 1107. CR2 may equal CR1.

In the circuit of FIG. 12a, a NAND string includes storage elements 1272, 1274 and 1276 in communication with word lines WL63, WL62 and WL61, respectively, for example, and with a bit line (BL1) 1264 via a USGD transistor 1270. The bit line 1264 communicates with a BLS transistor 1262 and a BLC transistor 1254, which is coupled to a COM2 path 1252. An input to an INV transistor 1260, which may be an nMOS, is an inverse of an input to a LAT transistor 1256, which may be a PiFET which receives a power supply Vddsa via a terminal 1258. Similarly, an input to a LAT transistor 1246, which may be an nMOS, is an inverse of an input to an INV transistor 1250, which may be a PiFET which receives Vddsa via a terminal 1248. In one path, a BLX transistor 1206 extends between a COM1 path 1210 and a power supply terminal 1202. In another path, an HLL transistor 1204 and an XXL transistor 1208 extend between the COM1 path 1210 and the power supply terminal 1202.

The COM1 path 1210 is connected to a bus terminal 1245 via a SET transistor 1244 for input and output of data. A sense SEN path 1212 is connected to a clock (CLK) terminal 1216 via a capacitor 1214. The SEN path 1212 is coupled to an INV path 1224 via a piFET transistor 1222, and the INV path 1224 is coupled to the bus terminal 1245 via a RST_NCO transistor 1242. The transistor 1222 is coupled to a power supply node 1218 via a piFET STBn transistor 1220 which receives a strobe signal during sensing. The INV path 1224 is also coupled to ground via an STBn transistor 1238 and a pull down transistor 1240.

A LAT path 1237 is an inverse of the INV path 1224. The LAT path 1237 is coupled to a power supply node 1032 via a piFET transistor 1234, and to a power supply node 1226 via a piFET transistor 1230 and a RST_PCO piFET transistor 1228. The LAT path 1237 is also coupled to ground via a pull down transistor 1236.

During an iteration of a program operation, for an inhibited bit line, from t1-t10, t10-t13, and t14-t21, conductive path 1253 is active.

For a full speed programmed bit line, or, outside t10-t14 in FIG. 11 (before t10 and after t14), for a partial speed programmed bit line, conductive path 1255 is active (FIG. 12c). The conductive path 1253 is used to ground the program bit line or partial speed programmed bit line when SET is high. When SET is low, BLprogram-full speed and BLprogram-partial speed, from t14 to t21, float.

The circuit of FIGS. 12a-c has only one latch whereas the design of FIG. 10a-d has two latches. Transistors INV 1260 and LAT 1256 will be on or off together, and transistors INV 1250 and LAT 1246 will be on or off together. The programming iteration from t1-t10 and t14-t21 can be summarized as follows:

| Pattern: | Full speed program | Partial speed program | Inhibit |
|---|---|---|---|
| LAT | High | High | Low |
| INV | Low | Low | High |

The programming iteration from t10-t13 can be summarized as follows:

| Pattern: | Full speed program | Partial speed program | Inhibit |
|---|---|---|---|
| LAT | High | Low | Low |
| INV | Low | High | High |

From t5-t10 and t13-t14 (FIG. 11), BLC is shut off to isolate the bit line from the COM2 path 1252 so that the latch value can change.

Figure 13:
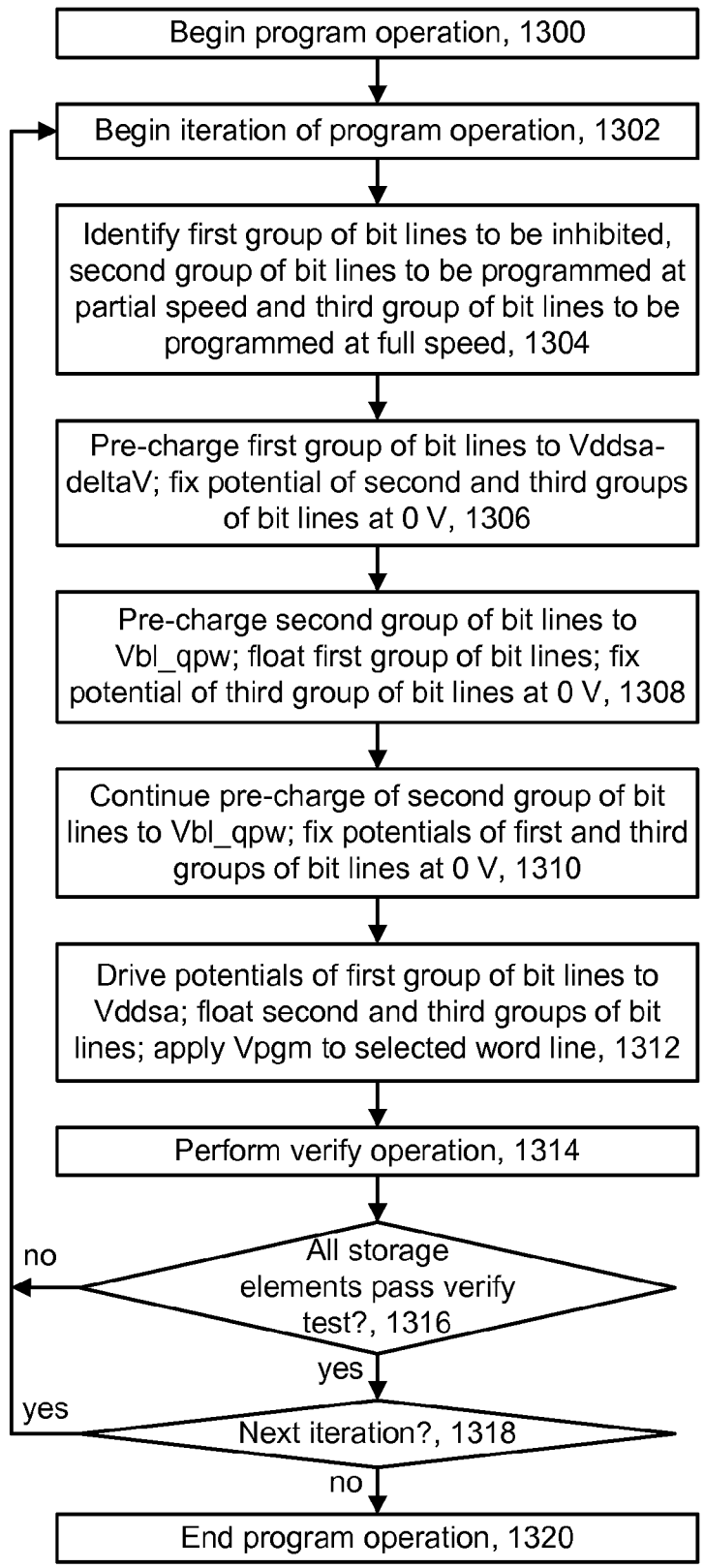
FIG. 13 depicts a program operation.

FIG. 13 depicts a program operation. A program operation begins at step 1300. An iteration of the program operation begins at step 1302. Step 1304 includes identifying a first group of bit lines to be inhibited. This typically includes bit lines associated with NAND string for which programming has been completed. Step 1304 also includes identifying a second group of bit lines to be programmed at a partial speed. This typically includes bit lines associated with a storage element which has reached a lower verify level but not a higher verify level. For example, in FIG. 6, this could include A-state storage elements which have reached VvaL but not VvaH, and B state storage elements which have reach VvaB but not VvbH. Step 1304 also includes identifying a third group of bit lines to be programmed at a full speed. This typically includes bit lines associated with a storage element which has not reached a lower verify level, where a lower verify level is used, or a nominal verify level where no lower and upper verify levels are used. For example, in FIG. 6, this could include A-state storage elements which have not reached VvaL, B-state storage elements which have not reach VvaB, and C-state storage elements which have not reached Vvc.

Step 1306 includes pre-charging the first group of bit lines to an initial level Vddsa-ΔV, and fixing the potential of the second and third groups of bit lines at a steady state level Vss such as 0 V. This occurs at t1-t3 in the example of FIG. 9 or at t1-t10 in the example of FIG. 11. Step 1308 includes pre-charging the second group of bit lines to an initial level Vbl_qpw, floating the first group of bit lines, and fixing the potential of the third group of bit lines at a steady state level Vss such as 0 V. This occurs at t3-t4 in the example of FIG. 9 or at t10-t13 in the example of FIG. 11. Step 1310 includes continuing the pre-charge of the second group of bit lines to Vbl_qpw, and fixing the potentials of the first and third groups of bit lines at a steady state level Vss such as 0 V. This occurs at t4-t5 in the example of FIG. 9 or at t13-t14 in the example of FIG. 11. Step 1312 includes driving the potentials of the first group of bit lines to Vddsa, floating the second and third groups of bit lines, and applying a program voltage Vpgm to the selected word line. This occurs at t5-t8 with Vpgm applied at t6-t7 in the example of FIG. 9, or at t14-t21 with Vpgm applied at t16-t19 in the example of FIG. 11.

A verify operation is performed at step 1314. Note that this may involve applying, in turn, word line verify voltages at the different levels depicted in FIG. 6. At decision step 1316, if all storage elements do not pass the verify test, a further iteration of the program operation is performed at step 1302. If decision step 1316 is true, a determination is made at decision step 1318 as to whether a further iteration is needed. If all storage elements have been verified to meet the higher verify level, when higher and lower verify levels are used, or the nominal level when only one verify level for a state is used, then the program operation ends at step 1320. If some storage elements have not yet been verified to reach a higher verify level, a further iteration of the program operation is performed at step 1302.

In one embodiment of the technology described herein, a method for operating non-volatile storage includes performing an iteration of a multiple-iteration program operation for a set of non-volatile storage elements, the set includes at least first, second and third strings of non-volatile storage elements in communication with first, second and third bit lines, respectively. The performing an iteration includes: (a) in a first time period, pre-charging a potential of the first bit line to a first level (Vddsa-ΔV) while fixing potentials of the second and third bit lines (Vss=0 V), (b) in at least part of a second time period after the first time period, pre-charging the second bit line to a second level (Vbl_qpw) while floating the first bit line and fixing the potential of the third bit line (Vss=0V), and (c) in a third time period after the second time period, driving the potential of the first bit line to a third level (Vddsa) which is higher than the first level (Vddsa-ΔV) while floating the second and third bit lines, and concurrently applying a program voltage (Vpgm) to a non-volatile storage element in the first string, a non-volatile storage element in the second string, and a non-volatile storage element in the third string.

In another embodiment, a non-volatile storage system includes a set of storage elements on a substrate, where the set includes at least first, second and third strings of non-volatile storage elements, first, second and third bit lines in communication with the first, second and third strings, respectively, and at least one control circuit in communication with the set of storage elements and the first, second and third bit lines. The at least one circuit, to perform an iteration of a multiple-iteration program operation for the set of non-volatile storage elements: (a) in a first time period, pre-charges a potential of the first bit line to a first level (Vddsa-ΔV) and concurrently fixes potentials of the second and third bit lines (Vss=0V), (b) in at least part of a second time period after the first time period, pre-charges the second bit line to a second level (Vbl_qpw) and concurrently floats the first bit line and fixes the potential of the third bit line (Vss=0 V), and (c) in a third time period after the second time period, drives the potential of the first bit line to a third level (Vddsa) which is higher than the first level (Vddsa-ΔV) and concurrently floats the second and third bit lines, and applies a program voltage (Vpgm) to a non-volatile storage element in the first string, a non-volatile storage element in the second string, and a non-volatile storage element in the third string.

In another embodiment, a method for operating a non-volatile storage system includes (a) identifying, in a set of non-volatile storage elements formed on a substrate, a first string of non-volatile storage elements for which programming is to be inhibited during an iteration of a program operation, (b) identifying, in the set of non-volatile storage elements, a second string of non-volatile storage elements for which programming is to be allowed at a reduced speed during the iteration of a program operation, (c) identifying, in the set of non-volatile storage elements, a third string of non-volatile storage elements for which programming is to be allowed at a full speed during the iteration of a program operation, (d) pre-charging a first channel in the substrate which is associated with the first string of non-volatile storage elements to a first level while fixing potentials of second and third channels in the substrate which are associated with the second and third strings of non-volatile storage elements, respectively, (e) subsequently pre-charging the second channel to a second level while floating the first channel and fixing the potential of the third channel, and (f) subsequently driving the first channel to a third level which is higher than the first level while floating the second and third channels, and while applying a program voltage to a non-volatile storage element in the first string, a non-volatile storage element in the second string, and a non-volatile storage element in the third string.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

We claim:

1. A method for operating a non-volatile storage system, comprising:
performing an iteration of a multiple-iteration program operation for a set of non-volatile storage elements, the set includes at least first, second and third strings of non-volatile storage elements in communication with first, second and third bit lines, respectively;
the performing an iteration includes:
(a) in a first time period, pre-charging a potential of the first bit line to a first level while fixing potentials of the second and third bit lines;
(b) in at least part of a second time period after the first time period, pre-charging the second bit line to a second level while floating the first bit line and fixing the potential of the third bit line; and
(c) in a third time period after the second time period, driving the potential of the first bit line to a third level which is higher than the first level while floating the second and third bit lines, and concurrently applying a program voltage to a non-volatile storage element in the first string, a non-volatile storage element in the second string, and a non-volatile storage element in the third string.

2. The method of claim 1, wherein:
the first bit line is adjacent to the second bit line; and
in the third time period, the potential of the second bit line is coupled higher by capacitive coupling from the driving the first bit line to the third level.

3. The method of claim 1, wherein:
the first bit line is adjacent to the third bit line; and
in the third time period, the potential of the third bit line is coupled higher by capacitive coupling from the driving the first bit line to the third level.

4. The method of claim 1, wherein:
in the second time period, the potential of the first bit line floats higher and then decays back toward the first level.

5. The method of claim 1, wherein:
in the third time period, the potential of the second bit line is lower than the third level, and the potential of the third bit line is lower than the potential of the second bit line.

6. The method of claim 1, wherein:
the potential of the third bit line is fixed at 0 V in the first and second time periods.

7. The method of claim 1, wherein:
the potential of the third bit line is fixed at 0 V in the first and second time periods, and the potential of the second bit line is fixed at 0 V in the first time period.

8. The method of claim 1, wherein:
at an end of the second time period, the first bit line is driven at the first pre-charge level.

9. The method of claim 1, wherein:
in the third time period, the potential of the first bit line inhibits programming of the non-volatile storage element in the first string, the potential of the second bit line allows programming at a reduced speed of the non-volatile storage element in the second string, and the potential of the third bit line results in programming at a full speed of the non-volatile storage element in the third string.

10. The method of claim 9, wherein:
the performing the iteration further includes performing a verify operation in a fourth time period after the third time period by verifying the non-volatile storage element in the second string against an upper verify level of a data state, and verifying the non-volatile storage element in the third string against a lower verify level of the data state.

11. A non-volatile storage system, comprising:
a set of non-volatile storage elements on a substrate, the set includes at least first, second and third strings of non-volatile storage elements;
first, second and third bit lines in communication with the first, second and third strings, respectively; and
at least one circuit in communication with the set of non-volatile storage elements and the first, second and third bit lines, the at least one circuit, to perform an iteration of a multiple-iteration program operation for the set of non-volatile storage elements: (a) in a first time period, pre-charges a potential of the first bit line to a first level and concurrently fixes potentials of the second and third bit lines, (b) in at least part of a second time period after the first time period, pre-charges the second bit line to a second level and concurrently floats the first bit line and fixes the potential of the third bit line, and (c) in a third time period after the second time period, drives the potential of the first bit line to a third level which is higher than the first level and concurrently floats the second and third bit lines, and applies a program voltage to a non-volatile storage element in the first string, a non-volatile storage element in the second string, and a non-volatile storage element in the third string.

12. The non-volatile storage system of claim 11, wherein:
in the third time period, the potential of the first bit line inhibits programming of the non-volatile storage element in the first string, the potential of the second bit line allows programming at a reduced speed of the non-volatile storage element in the second string, and the potential of the third bit line results in programming at a full speed of the non-volatile storage element in the third string.

13. The non-volatile storage system of claim 11, wherein:
the first bit line is adjacent to the second bit line; and
in the third time period, the potential of the second bit line is coupled higher by capacitive coupling from the driving the first bit line to the third level.

14. The non-volatile storage system of claim 11, wherein:
the first bit line is adjacent to the third bit line; and
in the third time period, the potential of the third bit line is coupled higher by capacitive coupling from the driving the first bit line to the third level.

15. The non-volatile storage system of claim 11, wherein:
the first, second and third strings of non-volatile storage elements comprises respective NAND strings, and the at least one circuit applies the program voltage to the non-volatile storage element in the first string, the non-volatile storage element in the second string, and the non-volatile storage element in the third string via a common word line.

16. A method for operating a non-volatile storage system, comprising:
identifying, in a set of non-volatile storage elements formed on a substrate, a first string of non-volatile storage elements for which programming is to be inhibited during an iteration of a program operation;
identifying, in the set of non-volatile storage elements, a second string of non-volatile storage elements for which programming is to be allowed at a reduced speed during the iteration of a program operation;
identifying, in the set of non-volatile storage elements, a third string of non-volatile storage elements for which programming is to be allowed at a full speed during the iteration of a program operation;
pre-charging a first channel in the substrate which is associated with the first string of non-volatile storage elements to a first level while fixing potentials of second and third channels in the substrate which are associated with the second and third strings of non-volatile storage elements, respectively;
subsequently pre-charging the second channel to a second level while floating the first channel and fixing the potential of the third channel; and
subsequently driving the first channel to a third level which is higher than the first level while floating the second and third channels, and while applying a program voltage to a non-volatile storage element in the first string, a non-volatile storage element in the second string, and a non-volatile storage element in the third string.

17. The method of claim 16, wherein:
the first channel is adjacent to the second channel; and
in the third time period, the potential of the second channel is coupled higher by capacitive coupling from the driving the first channel to the third level.

18. The method of claim 16, wherein:
the first channel is adjacent to the third channel; and
in the third time period, the potential of the third channel is coupled higher by capacitive coupling from the driving the first channel to the third level.

19. The method of claim 16, wherein:
in the second time period, the potential of the first channel floats higher and then decays back toward the first level.

20. The method of claim 16, wherein:
during the driving the first channel to the third level, the potential of the second channel is lower than the third level, and the potential of the third channel is lower than the potential of the second channel.

* * * * *